(12) United States Patent
Xu et al.

(10) Patent No.: US 8,319,099 B2
(45) Date of Patent: Nov. 27, 2012

(54) LOCKING DEVICE AND ELECTRONIC ENCLOSURE USING THE SAME

(75) Inventors: Chang-Zheng Xu, Shenzhen (CN); Yang-Ming Lin, Shenzhen (CN); Hsuan-Tsung Chen, Taipei Hsien (CN); Guang-Yao Lee, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 350 days.

(21) Appl. No.: 12/869,779

(22) Filed: Aug. 27, 2010

(65) Prior Publication Data

US 2011/0147034 A1 Jun. 23, 2011

(51) Int. Cl.
*H05K 5/00* (2006.01)
*E05C 3/12* (2006.01)

(52) U.S. Cl. ..... 174/50; 174/559; 174/520; 361/679.02; 361/679.55; 361/679.27; 292/194; 292/213

(58) Field of Classification Search ............ 174/50, 174/66, 67, 520, 535, 559, 561, 562; 361/600, 361/679.02, 679.01, 697.58, 679.27, 727, 361/681, 726, 679.55, 679.09; 292/95, 194, 292/213, 156, 128, 102, 100, 108, 175, 146, 292/150, 153, 137, 163, 164, 177, 179, DIG. 63, 292/87

See application file for complete search history.

(56) References Cited

U.S. PATENT DOCUMENTS

| | | | | |
|---|---|---|---|---|
| 4,964,661 A | * | 10/1990 | Cadwell et al. | 292/87 |
| 6,935,661 B1 | * | 8/2005 | Farnsworth et al. | 292/128 |
| 7,168,745 B2 | * | 1/2007 | Jamnia et al. | 292/156 |
| 7,374,438 B2 | * | 5/2008 | Jiang et al. | 361/679.55 |
| 7,417,851 B2 | * | 8/2008 | Chen et al. | 361/679.27 |
| 8,200,298 B2 | * | 6/2012 | Matsuoka | 361/679.09 |

\* cited by examiner

*Primary Examiner* — Angel R Estrada
(74) *Attorney, Agent, or Firm* — Altis Law Group, Inc.

(57) ABSTRACT

An electronic enclosure includes a base, a cover mounted on the base, a first locking module engaged on the cover, a second locking module, and a locking structure. The base defines a number of supporting recesses defined therein. The cover includes a number of barbs for matching with the supporting recesses of the base. The second locking module includes at least one locking member. The at least one locking member includes a pivot portion pivotably engaging with the base, a first end and a second end opposite to the first end. The locking structure abuts the first end of the at least one locking member to rotate the second end to engage with the first locking module, whereby the cover is fixed on the base.

17 Claims, 16 Drawing Sheets

LOCKING DEVICE AND ELECTRONIC ENCLOSURE USING THE SAME

BACKGROUND

1. Technical Field

The present disclosure relates to locking devices, and particularly to a locking device for an electronic enclosure.

2. Description of Related Art

An enclosure of an electronic device such as a computer housing or a monitor, includes a base and a cover covering the base. Electronic elements such as a main board can be assembled to the base and then the cover is applied to seal the enclosure, protecting the electronic elements.

Conventionally, a number of screws are applied to lock the cover to the base. However, such methods need additional tools such as screwdrivers to be used during the assembly, which is time consuming and troublesome.

Therefore, there is room for improvement within the art.

DETAILED DESCRIPTION

Figure 1:
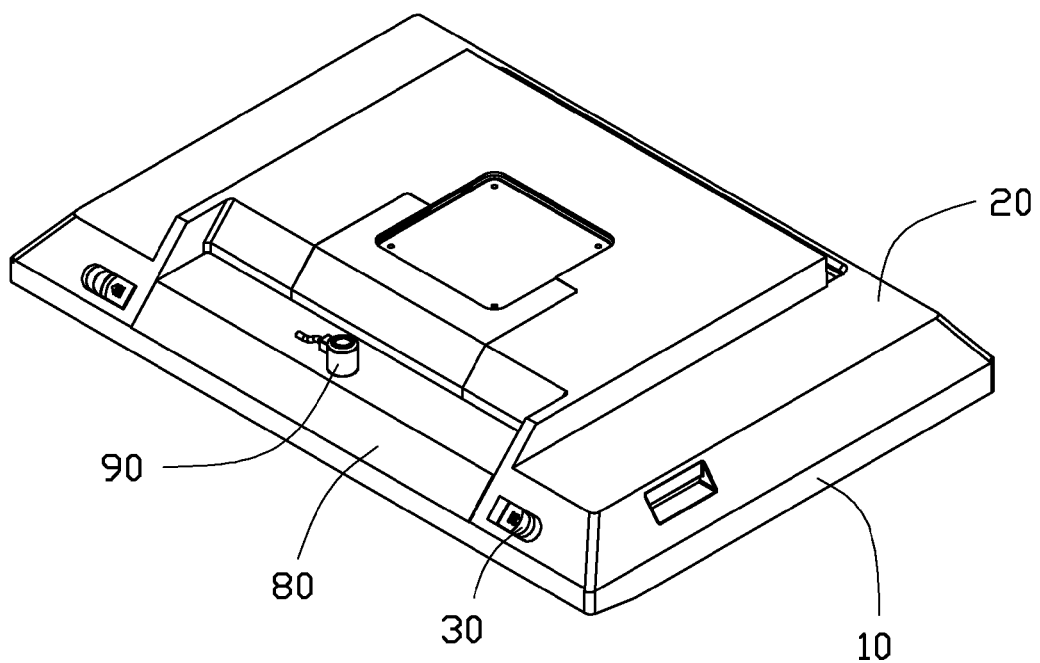
FIG. 1 is an isometric view of a locking device in accordance with an exemplary embodiment of the disclosure applied to a monitor.
Figure 2:
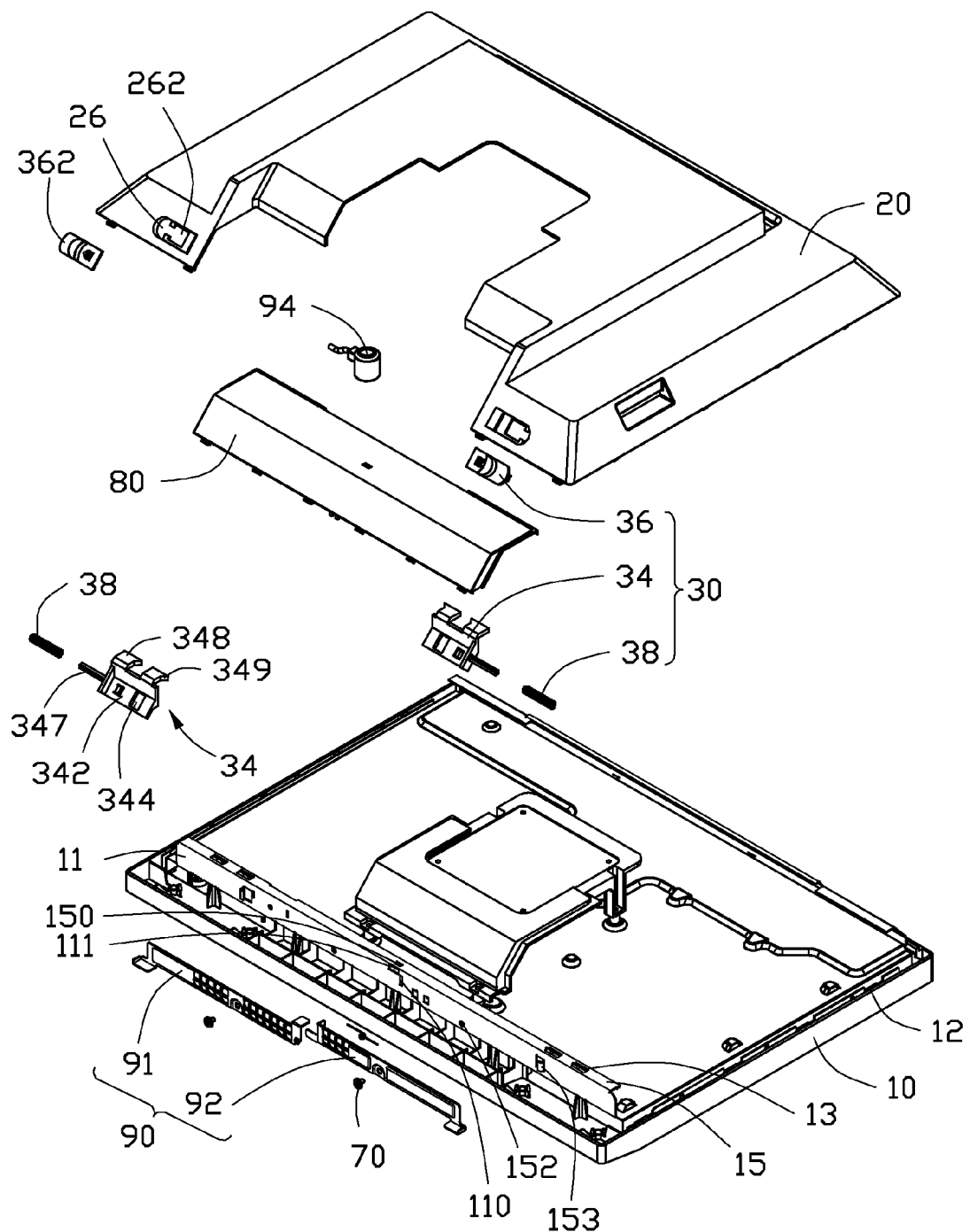
FIG. 2 is an exploded, isometric view of the locking device of FIG. 1.
Figure 3:
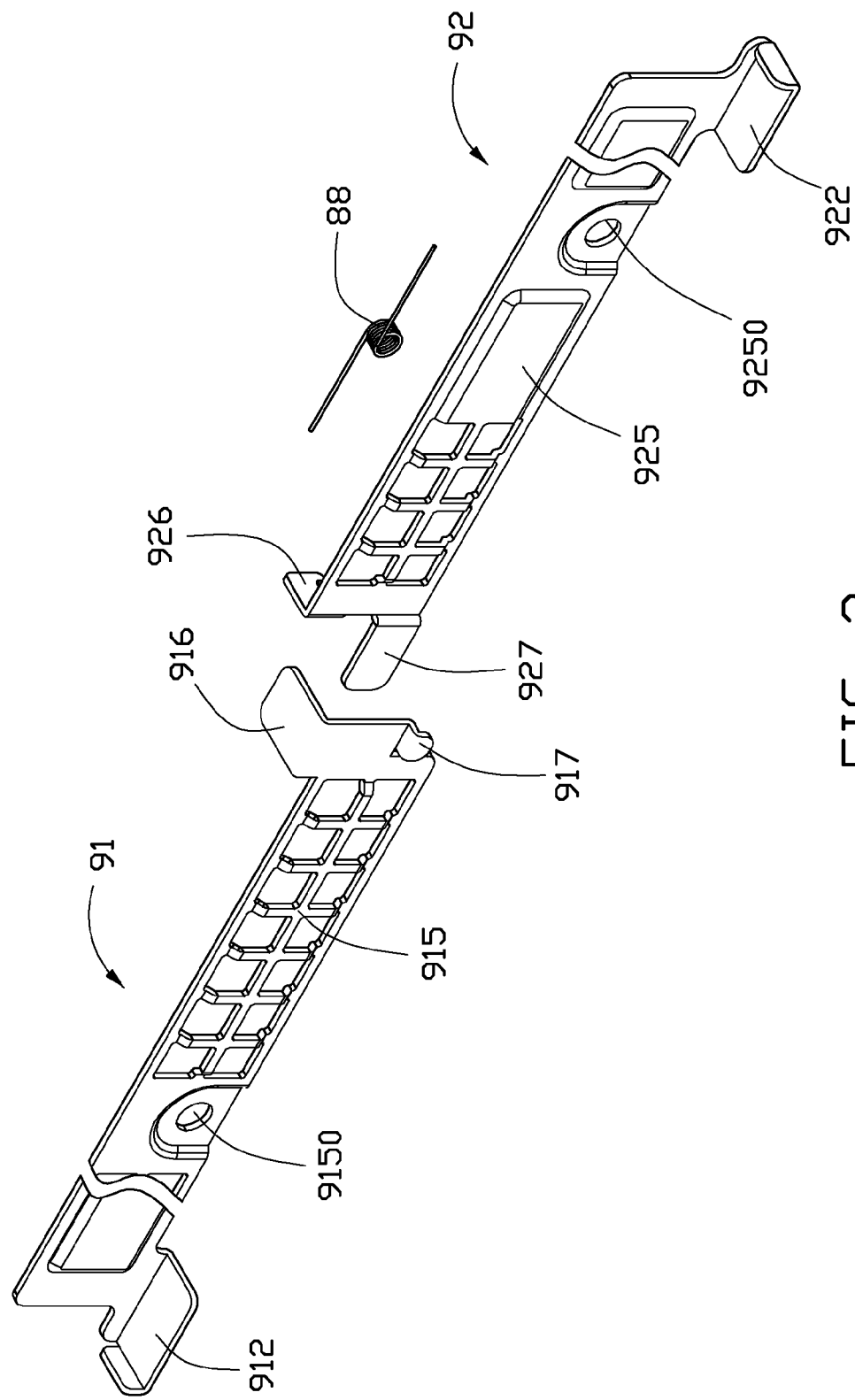
FIG. 3 is an exploded, isometric view of a second locking module of the locking device of FIG. 1.
Figure 4:
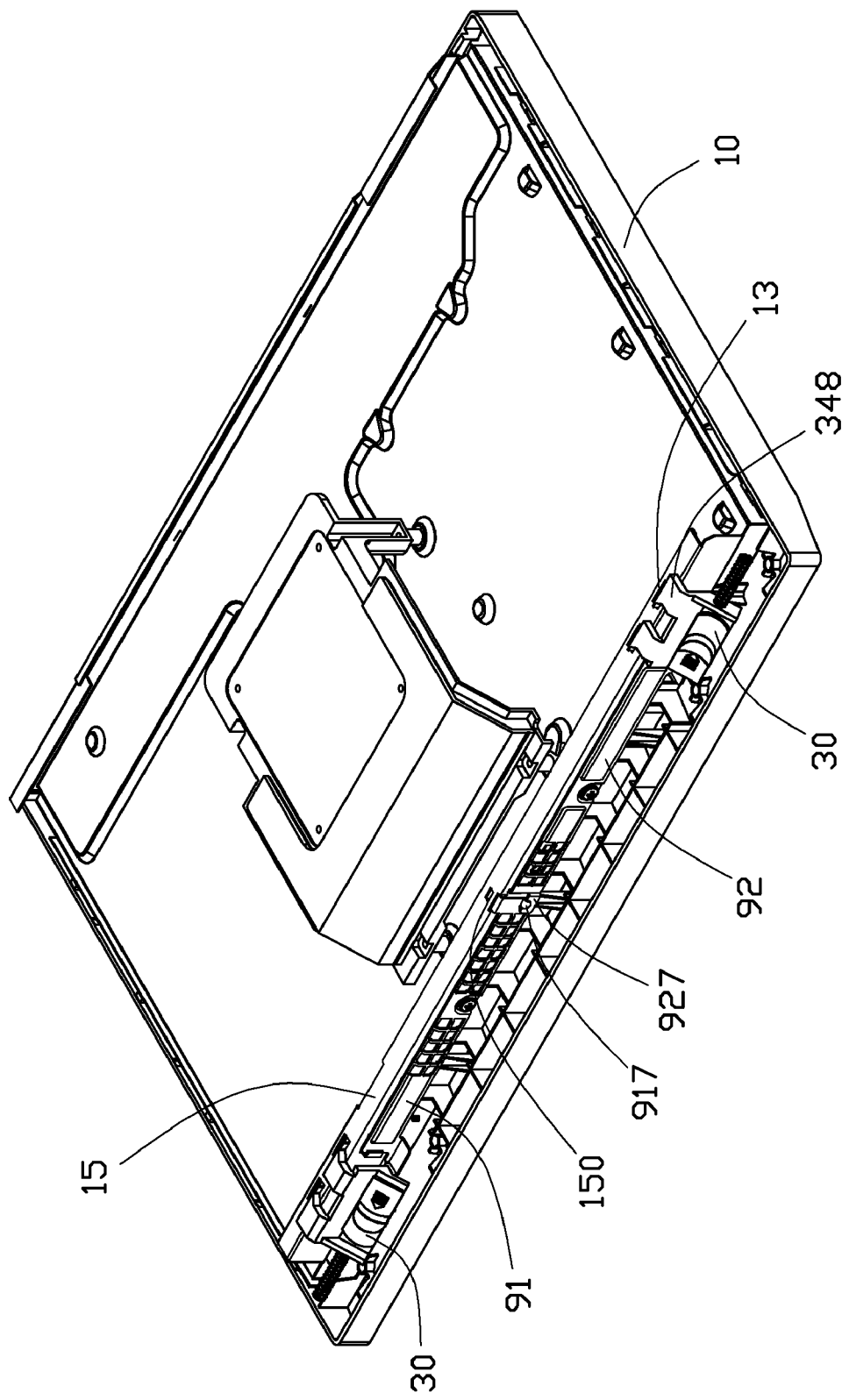
FIG. 4 is an assembled, isometric view of a first locking module and the second locking module and a base of the monitor in FIG. 2.

The locking device for an electronic enclosure in accordance with an exemplary embodiment of the present disclosure is applied to a monitor as an example. Understandably, the locking device can be used in computer housings or other electronic devices.

Referring to FIGS. 1-4, the electronic enclosure includes a base 10, a cover 20, a back plate 80, and a locking device. The locking device includes a first locking module 30 assembled on the cover 20, and a second locking module 90 assembled on the base 10. The second locking module 90 is used to lock to the first locking module 30 and fasten the back plate 80 on the base 10. In other embodiments, the back plate 80 and the cover 20 can be integrally made.

Figure 5:
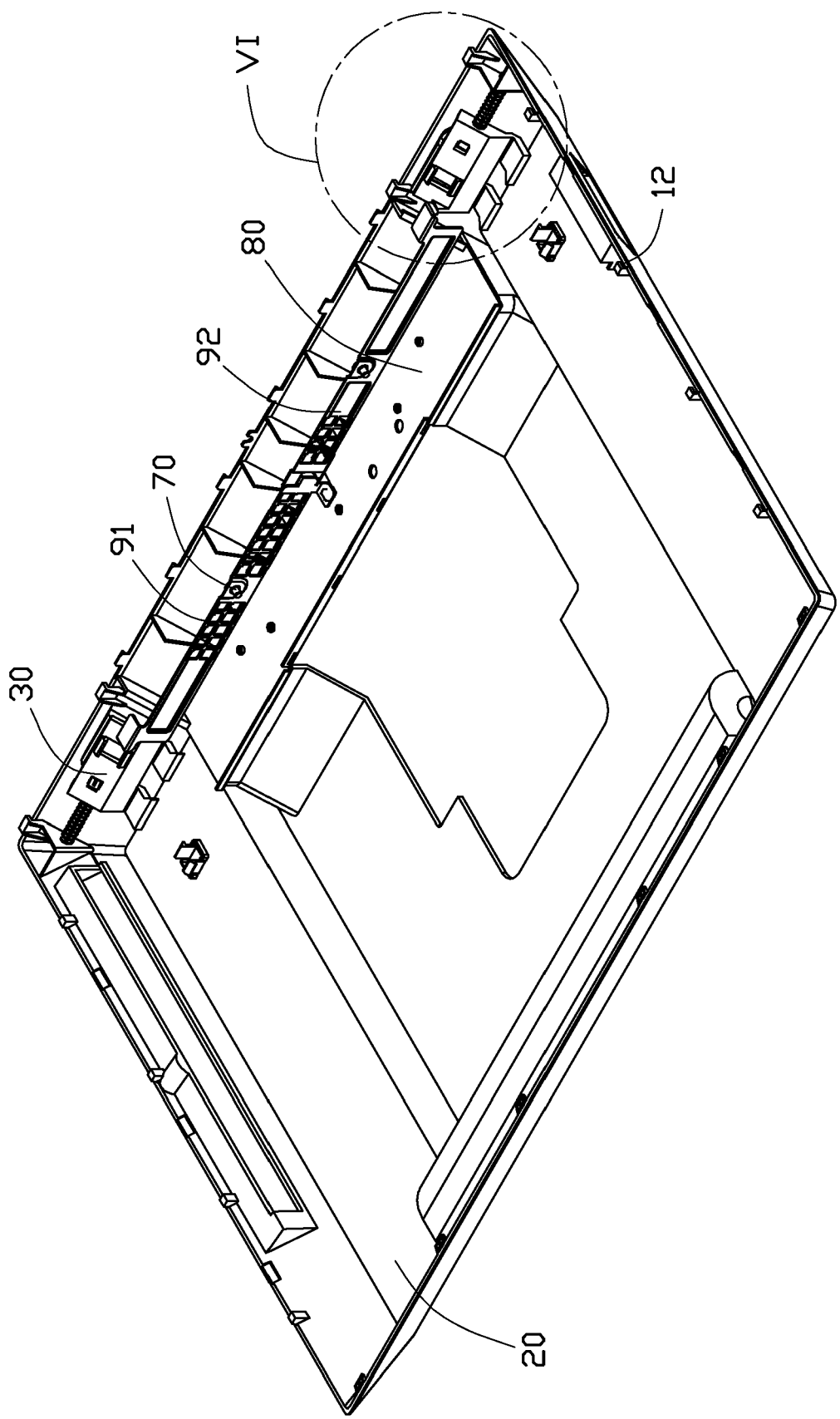
FIG. 5 is an assembled, inverted view of the first locking module and the second locking module and the cover in FIG. 2.
Figure 6:
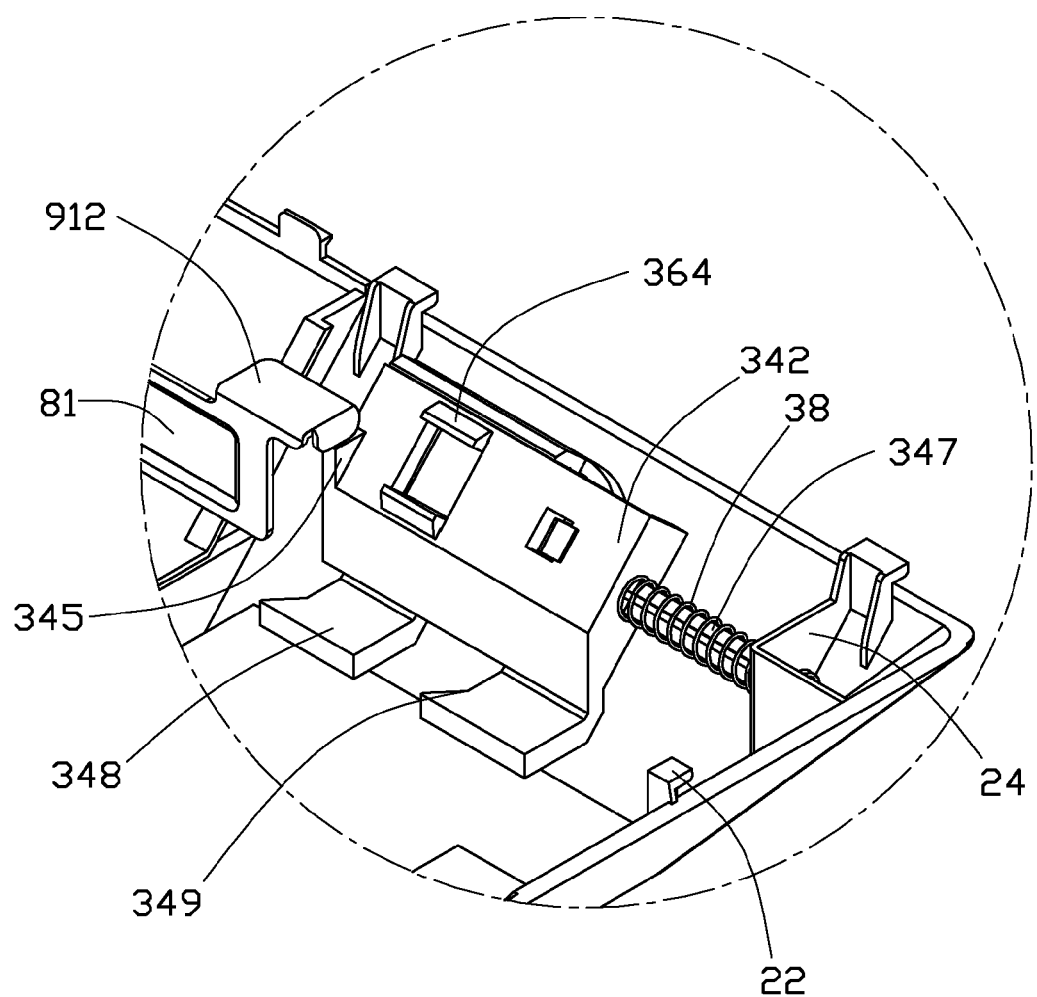
FIG. 6 is an enlarged view of a circled portion VI of FIG. 5.
Figure 7:
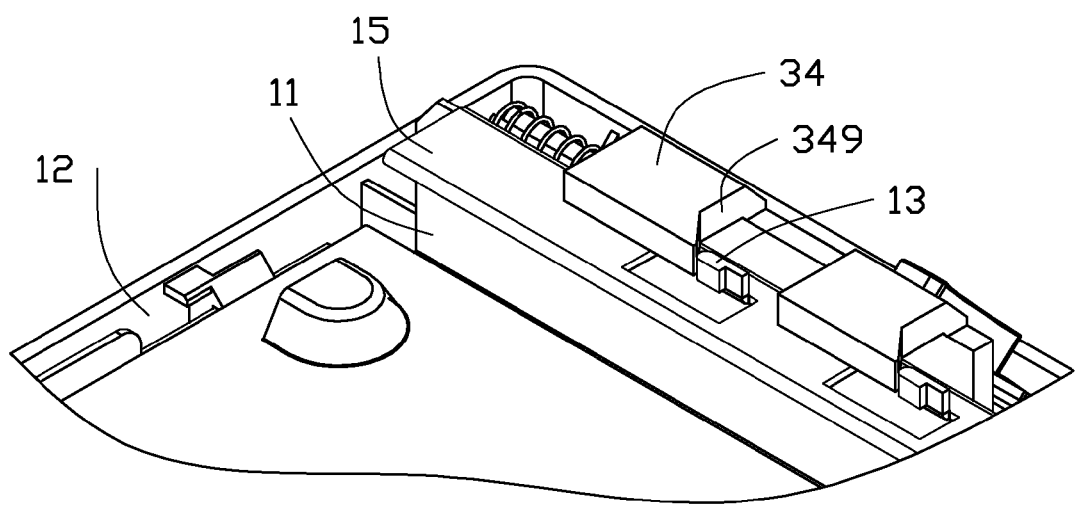
FIG. 7 is an isometric, partial view of the monitor with the first locking module in an unlocked position, where the cover has been removed for clarity.

Referring to FIGS. 5-7, the base 10 includes a baffle 11 extending upwards from a front end of the base 10. The baffle 11 is lengthwise and defines a supporting plate 15 extending backwards from a top edge of the baffle 11. The supporting plate 15 defines a slot 150 at a central portion thereof. Two blocks 13 extend from the supporting plate 15 at two ends thereof to respectively engage with the first locking module 30. The baffle 11 defines a horizontal recess 111 and a vertical recess 110. The horizontal recess 111 is defined below the slot 150 of the supporting plate 15, and the vertical recess 110 is defined at a right side of the horizontal recess 111. The baffle 11 further defines two pivot holes 152 at two sides of the horizontal recess 111. Two guiding pieces 153 extend forward from two ends the baffle 11. The base 10 defines a number of supporting recesses 12 at two sides thereof. The recesses 12 have entrances away from the blocks 13.

The cover 20 forms a number of barbs 22 extending down from each lateral side of the cover 20 to match with the supporting recesses 12 of the base 10 (see FIG. 6). The barbs 22 have entrances opposite to the entrances of the supporting recesses 12; thus, the barbs 22 of the cover 20 can be embedded in the supporting recesses 12 of the base 10 and restrict the forward and upward movement of the cover 20 relative to the base 10. A restricting wall 24 is formed at the bottom of the cover 20 and also formed in each corner of the front end of the cover 20 with a hole defined therein. Two concave portions 26 are defined in the front end of the cover 20 corresponding to the position of the first locking module 30. A notch 262 is defined in each of the concave portions 26.

The first locking module 30 includes two locking members respectively engaging with the concave portions 26 of the cover 20. Each locking member includes a main body 34 located below the corresponding concave portion 26 of the cover 20, an operation portion 36 extending through the corresponding notch 262 to connect the main body 34, and a flexible member 38 abutting between the main body 34 and the cover 20. Therefore, movement of the operation portion 36 and the main body 34 relative to the blocks 13 can lock (see a lock position in FIG. 4) or unlock (see an unlock position in FIG. 7) the cover 20 relative to the base 10. In other embodiments, the number of locking members of the first locking module 30 can be changed as needed, in this embodiment, the number of the locking members is one.

The main body 34 of each locking member includes a rectangular body 342, a connecting bar 347 extending from a lateral surface of one end of the rectangular body 342. A resisting portion 345 extending from a back surface of the other end of the rectangular body 342, and two toothed portions 348 extending rearward from a top portion of the main body 34. A free end of the connecting bar 347 extends through the hole of the restricting wall 24. The toothed portions 348 can engage with the blocks 13 of the supporting plate 15 following a forward or rearward movement of the cover 20 relative to the base 10. Each of the toothed portions 348 has a guiding surface 349 at the side away from the connecting bar 347. The rectangular body 342 defines a securing opening 344 for engaging with the operation portion 36.

Each of the flexible members 38 is a spring in this embodiment and mounted on the connecting bar 347 of the main body 34. The flexible member 38 has one end securing on the rectangular body 342, and an opposite end securing on the restricting wall 24 of the cover 20.

Each of the operation portions 36 includes a flat handle 362 and two hooks 364 (see FIG. 5) extending from a back surface of the flat handle 362. The flat handle 362 is received in the concave portion 26 of the cover 20. The hooks 364 extend through the notch 262 of the cover 20 and engage in the securing opening 344, thereby connecting the main body 34 and the operation portion 36. The hooks 364 are removable in the notch 262 of the cover 20; thus, the locking member can slide lengthwise relative the cover 20.

Referring again to FIGS. 2-4, the second locking module 90 includes a first locking member 91, a second locking member 92, and a locking structure. In this embodiment, the locking structure is a turnable lock 94. The first locking member 91 and the second locking member 92 respectively engage two sides of the baffle 11. The lock 94 extends through the back plate 80. The first locking member 91 includes an elongated pivot portion 915. A clasping portion 912 extending from a bottom edge of the left end of the pivot portion 915, a supporting portion 916 extending rearward from a top edge of a right end of the pivot portion 915, and a pressing portion 917 extending from a bottom of the right end of the pivot portion 915. The clasping portion 912 is L-shaped and engages with the resisting portion 345 of the left locking member of the first locking module 30. The supporting portion 916 is inserted into the horizontal recess 111 of the baffle 11 and has a movement in a vertical direction relative in the horizontal recess 111. The pressing portion 917 has an L-shaped configuration and is bent downward. The second locking member 92 includes an elongated pivot portion 925, a clasp 922 extending from a bottom edge of a right end of the pivot portion 925, a supporting portion 926 extending rearward from a top edge of a right end of the pivot portion 925, and an inserting portion 927 extending from a right end of the pivot portion 915. The clasp 922 is L-shaped and engages the resisting portion 345 of the right locking member of the first locking module 30. The supporting portion 926 is inserted into the vertical recess 110 of the baffle 11 and has a movement in a vertical direction relative in the vertical recess 110. The inserting portion 927 is inserted into the pressing portion 917 and is sandwiched between the pivot portion 915 and the pressing portion 917. The pivot portions 915 and 925 each define a pivot hole 9150 and 9250 in a central portion thereof, two pins 70 extending through the pivot holes 9150 and 9250 and the corresponding pivot holes 152 of the baffle 11 to pivotably secure the first locking member 91 and the second locking member 92 to the baffle 11.

Figure 8:
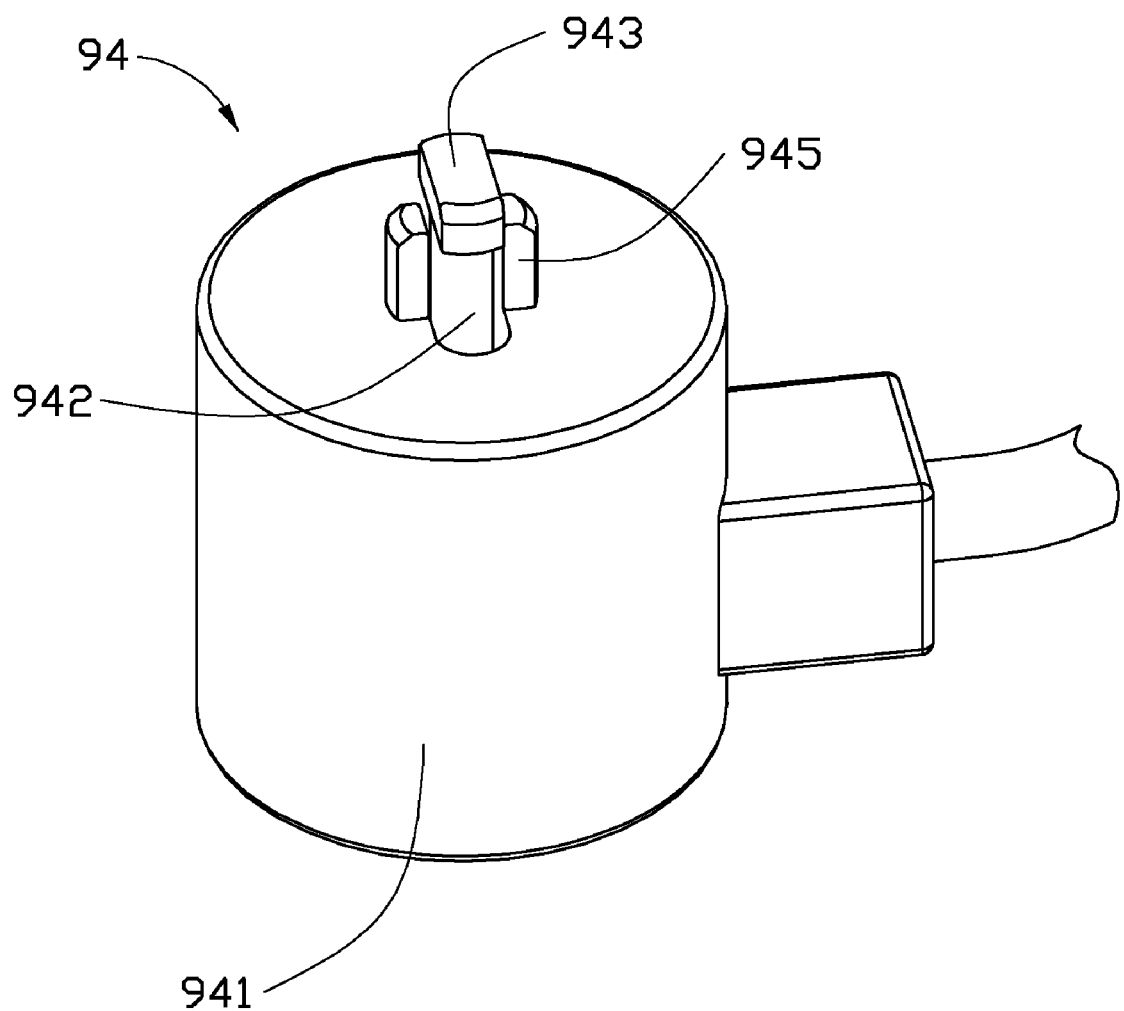
FIG. 8 is an isometric view of a turning lock of the monitor in FIG. 1, shown from a different aspect.

Referring to FIG. 8, the lock 94 is installed on the cover 20 to keep the electronic enclosure from being removed. The lock 94 includes a locking portion 941, a shaft 942 extending from a bottom of the locking portion 941, and two inserting portions 945 extending from the bottom of the locking portion 941 and sandwiching the shaft 942. The locking head 943 has an elongated configuration corresponding to the slot 150 of the supporting plate 15 of the base 10. When the lock 94 is in an unlocked position, the locking head 943 is rotated above the inserting portions 945, thereby being coplanar with the inserting portions 945 to extend through the slot 150 of the supporting plate 15. When the locking head 943 is received in the slot 150, the locking head 943 is then rotated following the shaft 942 with a key (not shown) to engage on the bottom surface of the supporting plate 15; at this time, the lock 94 is in a locked position.

Figure 9:
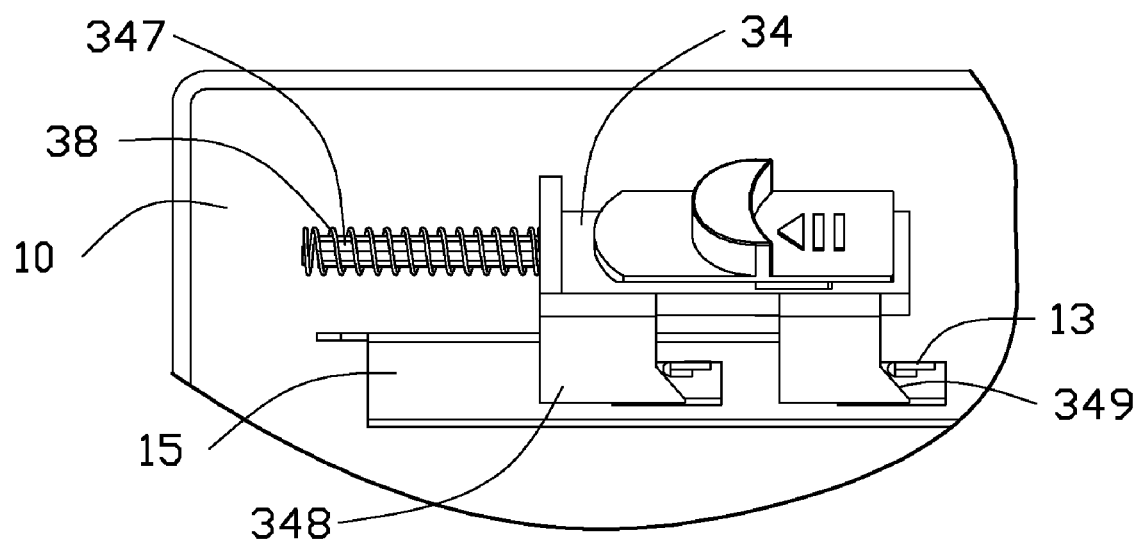
FIGS. 9-11 are isometric, partial views of the monitor with the first locking module from the unlocked position to a locked position.
Figure 10:
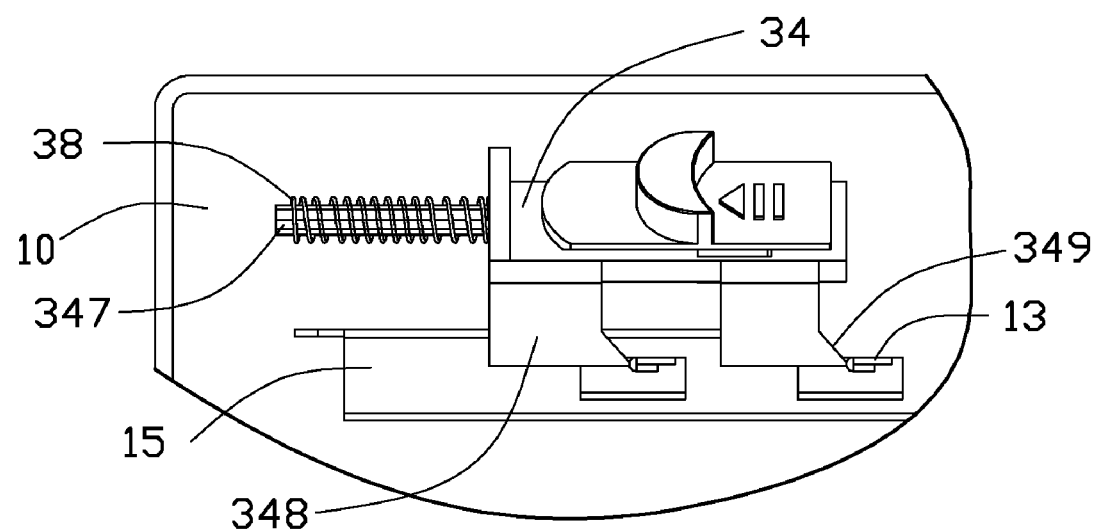
Figure 11:
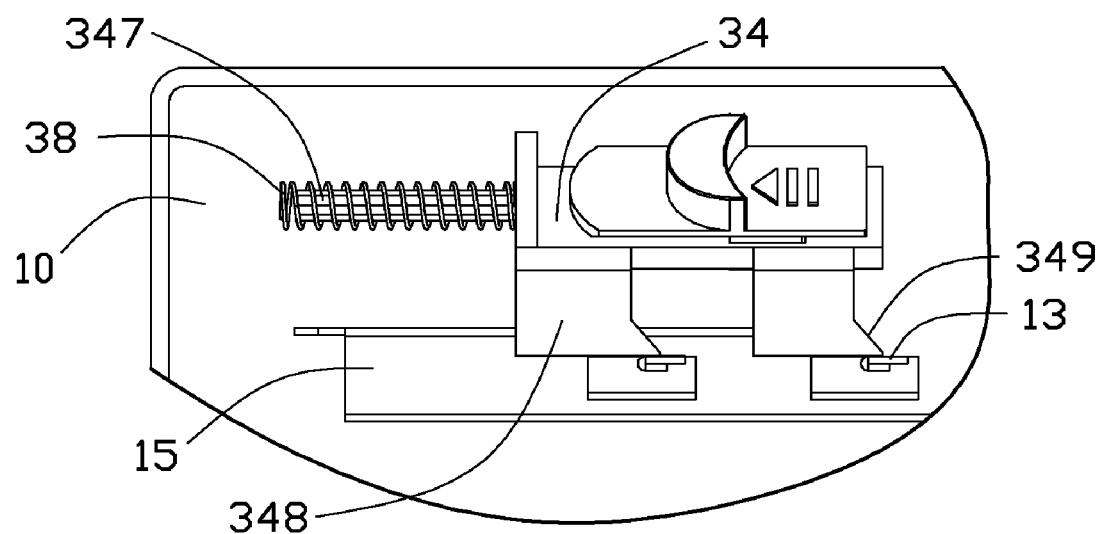

Referring to FIGS. 9-11, in assembly of the cover 20 and the base 10, the cover 20 is put on the base 10 and pushed forward. The barbs 22 of the cover 20 are embedded in the supporting recesses 12 of the base 10 to restrict the forward and upward movement of the cover 20 relative to the base 10. The toothed portions 348 of the first locking module 30 are pushed sideways by the blocks 13 of the supporting plate 15 along the guiding surface 349. Then the toothed portions 348 move beyond the blocks 13 and are pushed to the front of the blocks 13 by the flexible member 38. The blocks 13 restrict the backward movement of the cover 20 relative to the base 10; thus, the engagement of the cover 20 and the base 10 is completed. When the cover 20 is to be removed from the base 10, the operation portions 36 are manipulated to move towards the restricting walls 24, until the toothed portions 348 disengage from the blocks 13; then the cover 20 can be moved horizontally and backwards. The disengagement of the cover 20 and the base 10 and the engagement of the cover 20 and the base 10 are in reverse, therefore a detail description thereof is omitted. When the cover 20 is engaged on the base 10, the clasping portion 912 of the first locking member 91, and the clasp 922 of the second locking member 92 are disengaged with the resisting portions 345 of the first locking module 30.

Figure 12:
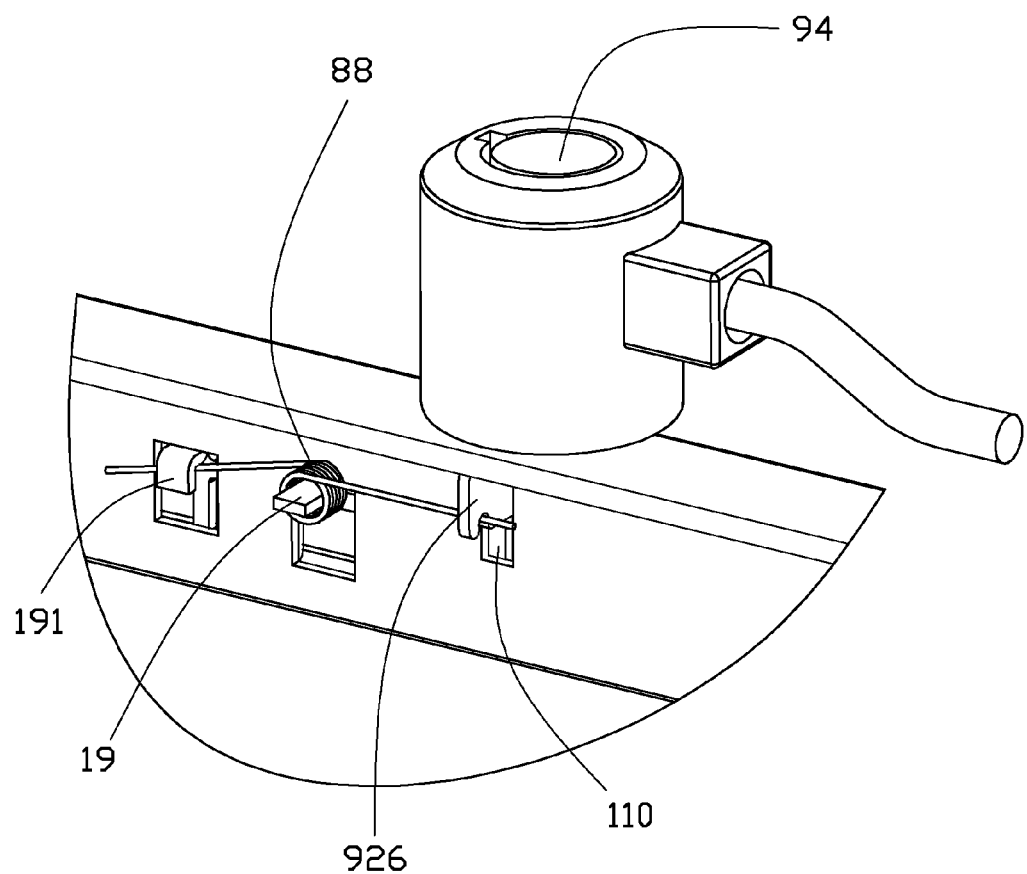
FIG. 12 is isometric view of the lock turning to engage with the base of the monitor of FIG. 1, where the cover has been removed for clarity.
Figure 13:
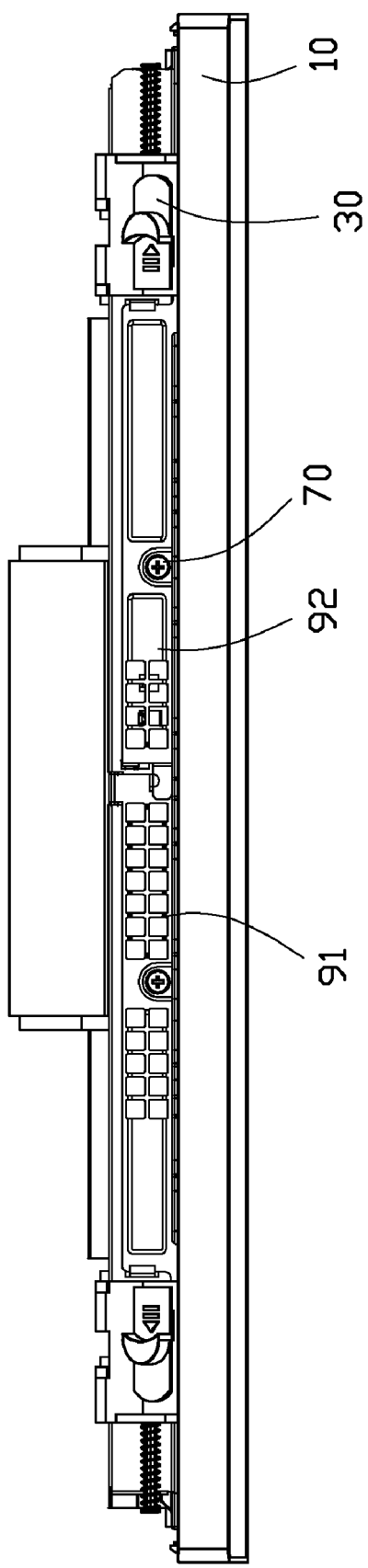
FIG. 13 is a front view of FIG. 4.
Figure 14:
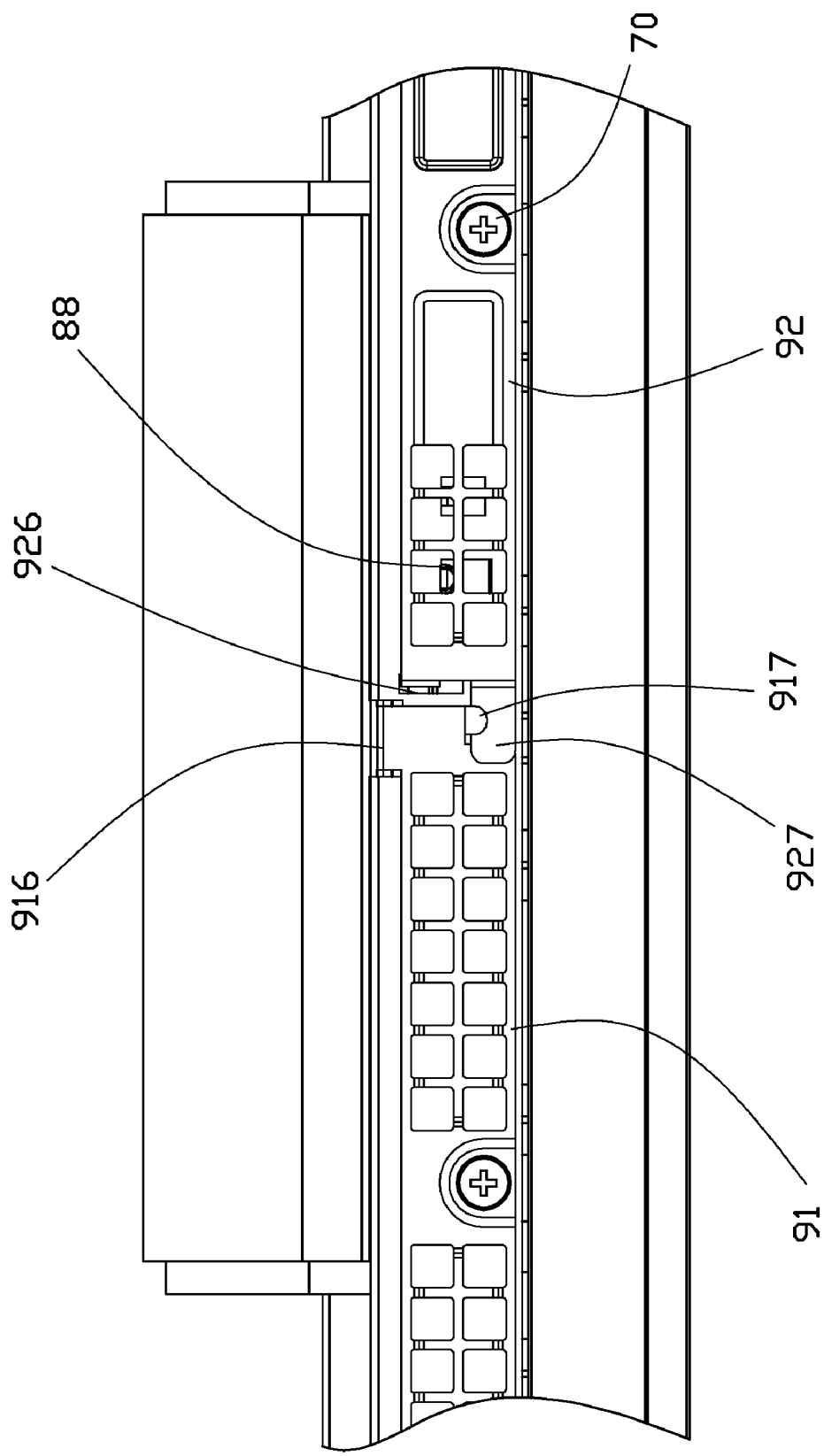
FIG. 14 is a partial view of FIG. 13, where the second locking module is in an unlocked position.

Referring also to FIGS. 12-14, in assembly of the second locking module 90 and the baffle 11, the first locking member 91 pivotably engages the baffle 11 with the supporting portion 916 inserted into the horizontal recess 111. The second locking member 92 pivotably engaging the baffle 11 with the supporting portion 926 inserted into the vertical recess 110. The pressing portion 917 abuts a top of the inserting portion 927. The baffle 11 extends a position bar 19 and a clasp 191 at a back surface opposite to the first locking member 91 and the second locking member 92. The elastic member 88 coils on the position bar 19, wherein a first end of the elastic member 88 upwardly abuts the clasp 191, and a second end of the elastic member 88 abuts a bottom of the pressing portion 926. The elastic member 88 is a torsion spring in this embodiment. The first end of the elastic member 88 forces the first locking member 91 and the second locking member 92 to upwardly abut the baffle 11. At this time, the first locking member 91 and the second locking member 92 remain substantially horizontal.

Figure 15:
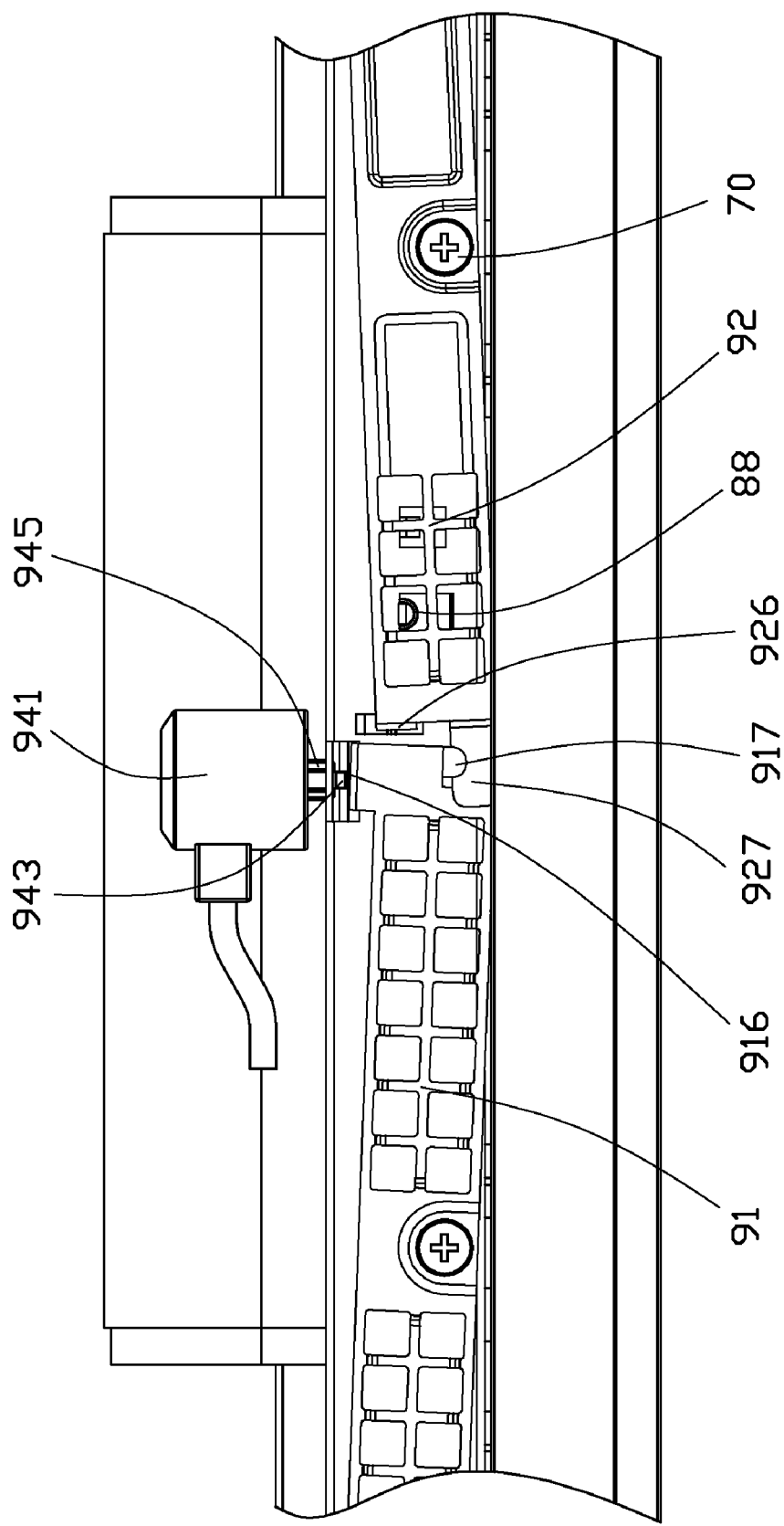
FIG. 15 is a partial view of FIG. 13, where the second locking module is in a locked position.
Figure 16:
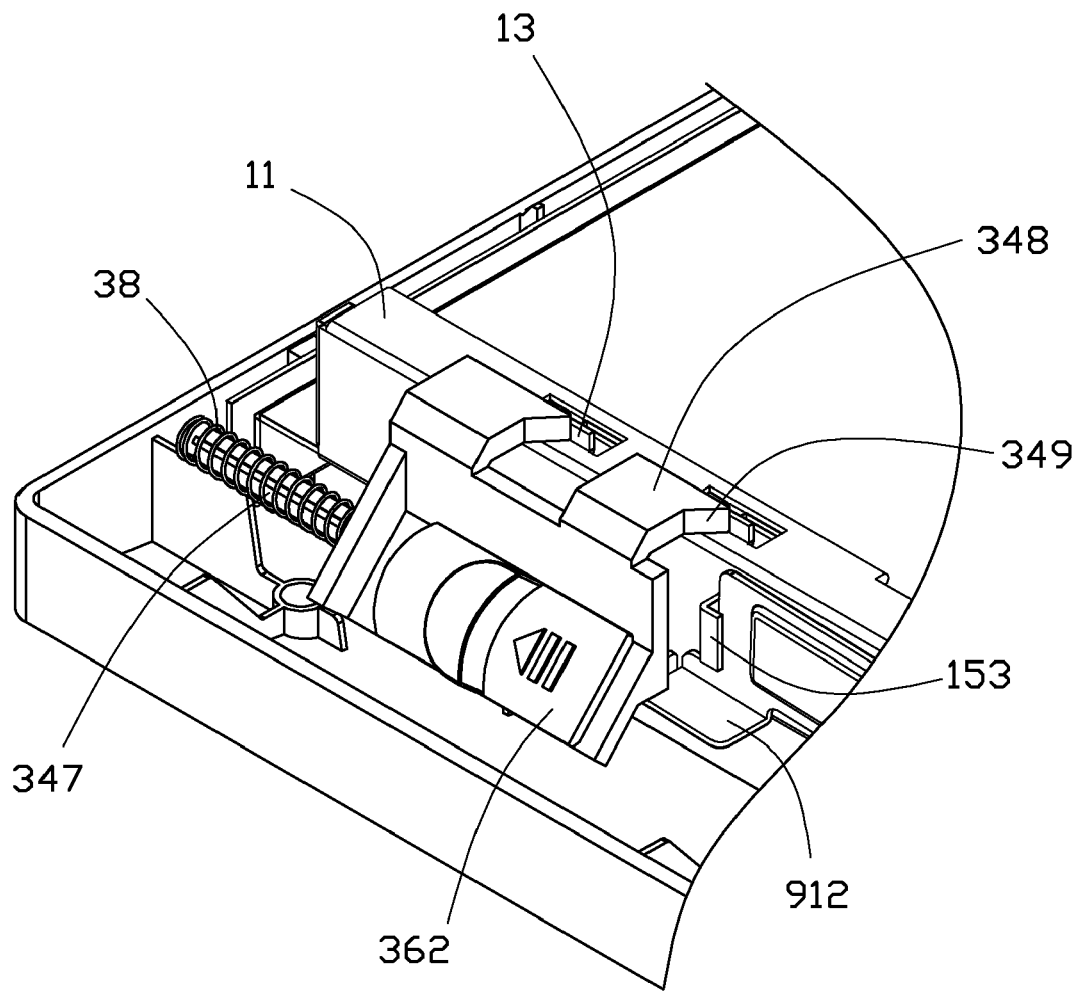
FIG. 16 is an isometric, partial view of the monitor with the first locking module in a locked position, where the cover has been removed for clarity.

Referring also to FIGS. 15-16, after the cover 20 is installed on the base 10, the back plate 80 is mounted on the base 10 to cover the first locking member 91 and the second locking member 92. The locking head 943 and the inserting portions 945 of the lock 94 extend through the back plate 80 and the slot 150 of the baffle 11. The elongated slot 150 of the supporting plate 15 restricts a revolution of the inserting portion 945. The locking head 943 abuts the supporting portion 916 of the first locking member 91, and presses the first and second locking members 91 and 92 to turn the fasteners 70 parallel to the baffle 11. The clasping portion 912 of the first locking member 91, and the clasp 922 of the second locking member 92 turn upward to engage resisting portions 345 of the first locking module 30 (see FIG. 16). Finally, the lock 94 is controlled by the key to turn the locking head 943 to be locked in the slot 150; thus, the first and second locking members 91 and 92 and the back plate 80 are locked by the lock 94 (see FIG. 15). The lock 94 has a cable (not labeled) securing to a heavy object such as a desk for locking the electronic enclosure.

In other embodiments, the first locking module 30 can be omitted and the second locking module 90 directly engages the cover 20. Furthermore, the second locking member 92 can be omitted as well as the elastic member 88 connecting the first locking member 91 and the baffle 11.

It is to be understood, however, that even though numerous characteristics and advantages of the present embodiments have been set forth in the foregoing description, together with details of the configurations and functions of the embodiments, the disclosure is illustrative only, and changes may be made in detail, especially in matters of shape, size, and arrangement of parts within the principles of the embodiments to the full extent indicated by the broad general meaning of the terms in which the appended claims are expressed.

The invention claimed is:

1. A locking device for an enclosure having a base and a cover mounted on the base, the locking device comprising:
   a locking module comprising at least one locking member, the at least one locking member comprising a pivot portion for pivotably engaging with the base, a clasping portion extending from an end of the pivot portion, and a supporting portion extending from the other end of the pivot portion; and
   a locking structure abutting the supporting portion of the at least one locking member to rotate the clasping portion to engage with the cover, whereby the cover is fixed on the base.

2. The locking device of claim 1, further comprising an elastic member connecting the at least one locking member and the base, wherein when the locking structure disengages with the supporting portion, the elastic member forces the clasping portion to disengage with the cover.

3. The locking device of claim 1, further comprising a number of supporting recesses defined in the base, and a number of barbs extending from the cover for matching with the supporting recesses of the base.

4. The locking device of claim 1, further comprising an additional locking member comprising a pivot portion for pivotably engaging with the base, a clasping portion extending from an end of the pivot portion for engaging the cover, and an inserting portion extending from the other end of the pivot portion to engage with the at least one locking member.

5. The locking device of claim 1, wherein the locking structure is a lock for engaging the cover and the base.

6. The locking device of claim 1, further comprising an additional locking module engaging with the cover, the additional locking module comprising a resisting portion to engage with the clasping portion of the at least one locking member.

7. The locking device of claim 6, wherein the additional locking module comprises a main body, an operation portion extending through the cover and connected with the main body, and a flexible member abutting between the main body and the cover.

8. An electronic enclosure, comprising:
   a base with a number of supporting recesses defined therein;
   a cover mounted on the base, the cover comprising a number of barbs for matching with the supporting recesses of the base;
   a locking module comprising a first locking member and a second locking member, the first locking member comprising a pivot portion pivotably engaging with the base, a first end and a second end opposite to the first end, the second locking member comprising a pivot portion pivotably engaging with the base, a first end engaged with the first end of the first locking member and a second end opposite to the first end of the second locking member; and
   a locking structure abutting the first end of the first locking member to rotate the second ends of the first and second locking members to engage with the first locking module, whereby the cover is fixed on the base.

9. The electronic enclosure of claim 8, wherein a pressing portion extending from a bottom of the first end of the first locking member, an inserting portion extending from first end of the second locking member to engage with the pressing portion of the first locking member.

10. The electronic enclosure of claim 8, wherein the base comprises a baffle and a supporting plate extending from a top edge of the baffle, the first and second locking members are pivotably engaged with the baffle.

11. The electronic enclosure of claim 10, wherein the first locking member extends a supporting portion from the first end thereof to insert into the baffle, the locking structure extending through the supporting plate and abutting the supporting portion of the first locking member.

12. The electronic enclosure of claim 10, wherein the second locking member extends a supporting portion to insert into the baffle, an elastic member connecting the supporting portion of the second locking member and the baffle.

13. An electronic enclosure, comprising:
   a base with a number of supporting recesses defined therein;
   a cover mounted on the base, the cover comprising a number of barbs for matching with the supporting recesses of the base;
   a first locking module engaged on the cover;
   a second locking module comprising at least one locking member, the at least one locking member comprising a pivot portion for pivotably engaging with the base, a first end and a second end opposite to the first end; and
   a locking structure abutting the first end of the at least one locking member to rotate the second end to engage with the first locking module, whereby the cover is fixed on the base.

14. The electronic enclosure of claim 13, wherein the second locking module further comprises an elastic member connecting the at least one locking member and the base, when the locking structure disengages with the first end of the at least one locking member, the elastic member forces the clasping portion to disengage with the cover.

15. The electronic enclosure of claim 13, wherein the second locking module comprising an additional locking member, the additional locking member comprising a pivot portion for pivotably engaging with the base, a first end engaging with the at least one locking member, and a second end engaging with the first locking module.

16. The electronic enclosure of claim 13, wherein the locking structure is a lock for engaging with the cover and the base.

17. The electronic enclosure of claim 13, wherein the first locking module comprises a main body to engage with the clasping portion of the at least one locking member, an operation portion extending through the cover and connected with the main body, and a flexible member abutting between the main body and the cover.

* * * * *

UNITED STATES PATENT AND TRADEMARK OFFICE
CERTIFICATE OF CORRECTION

PATENT NO. : 8,319,099 B2  
APPLICATION NO. : 12/869779  
DATED : November 27, 2012  
INVENTOR(S) : Chang-Zheng Xu et al.

Page 1 of 1

It is certified that error appears in the above-identified patent and that said Letters Patent is hereby corrected as shown below:

Title Page, below Item (65) insert

-- (30)    Foreign Application Priority Data

Dec. 17 2009   (CN) .............................2009 1 0311644 --

Signed and Sealed this  
Thirty-first Day of December, 2013

Margaret A. Focarino  
*Commissioner for Patents of the United States Patent and Trademark Office*